United States Patent
Chen et al.

(10) Patent No.: US 7,655,532 B1
(45) Date of Patent: Feb. 2, 2010

(54) STI FILM PROPERTY USING SOD POST-TREATMENT

(75) Inventors: Neng-Kuo Chen, Sinshih Township (TW); Kuo-Hwa Tzeng, Taipei (TW); Cheng-Yuan Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/179,892

(22) Filed: Jul. 25, 2008

(51) Int. Cl.
 *H01L 21/76* (2006.01)
(52) U.S. Cl. .............................. 438/424; 257/E21.546
(58) Field of Classification Search .................. 438/424; 257/E21.546
 See application file for complete search history.

(56) References Cited

U.S. PATENT DOCUMENTS

| | | | |
|---|---|---|---|
| 6,869,860 B2 * | 3/2005 | Belyansky et al. | 438/435 |
| 7,112,513 B2 * | 9/2006 | Smythe et al. | 438/431 |
| 2006/0205233 A1 * | 9/2006 | Hieda et al. | 438/778 |
| 2007/0004170 A1 * | 1/2007 | Kawasaki et al. | 438/452 |
| 2007/0207590 A1 * | 9/2007 | Kiyotoshi et al. | 438/424 |
| 2009/0035917 A1 * | 2/2009 | Ahn et al. | 438/425 |

\* cited by examiner

*Primary Examiner*—Charles D Garber
*Assistant Examiner*—Stanetta D Isaac
(74) *Attorney, Agent, or Firm*—Slater & Matsil, L.L.P.

(57) ABSTRACT

A method of forming a shallow trench isolation region includes providing a semiconductor substrate comprising a top surface; forming an opening extending from the top surface into the semiconductor substrate; filling a precursor into the opening using spin-on; performing a steam cure to the precursor to generate a dielectric material; after the steam cure, performing a chemical mechanical polish (CMP) to the dielectric material; and after the CMP, performing a steam anneal to the dielectric material.

13 Claims, 6 Drawing Sheets

STI FILM PROPERTY USING SOD POST-TREATMENT

TECHNICAL FIELD

This invention relates generally to integrated circuits, and more particularly to structures and manufacturing methods of shallow trench isolation (STI) regions.

BACKGROUND

Modern integrated circuits are formed on the surfaces of semiconductor substrates, which are mostly silicon substrates. Semiconductor devices are isolated from each other by isolation structures formed at the surface of the respective semiconductor substrates. The isolation structures include field oxides and STI regions.

Field oxides are often formed using local oxidation of silicon (LOCOS). A typical formation process includes blanket forming a mask layer on a silicon substrate, and then patterning the mask layer to expose certain areas of the underlying silicon substrate. A thermal oxidation is then performed in an oxygen-containing environment to oxidize the exposed portions of the silicon substrate. The mask layer is then removed.

Figure 1:
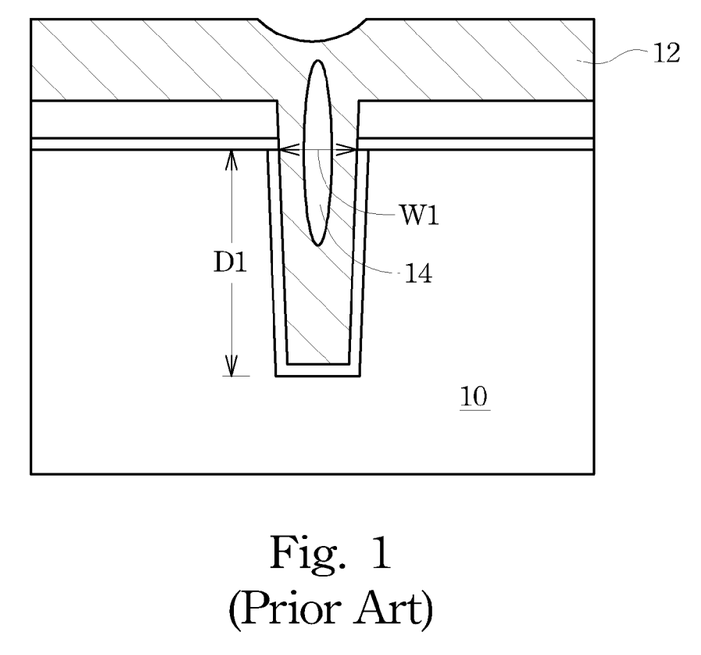
FIGS. 1 and 2 illustrate cross-sectional views in a conventional shallow trench isolation (STI) formation process.
Figure 2:
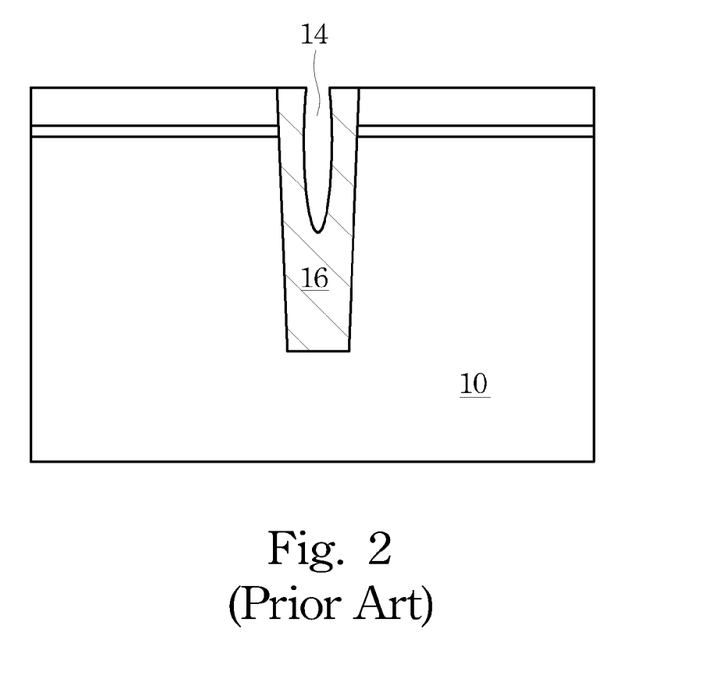

With the down-scaling of integrated circuits, STI regions are increasingly used as the isolation structures. FIGS. 1 and 2 illustrate intermediate stages in the formation of an STI region. First, an opening is formed in silicon substrate 10, for example, using etching. Oxide 12, preferably a silicon oxide, is filled into the opening, until the top surface of oxide 12 is higher than the top surface of silicon substrate 10. The opening has an aspect ratio, which equals to the ratio of depth D1 to width W1. The aspect ratio becomes increasingly greater when the integrated circuits are increasingly scaled down. For 40 nm technology and below, the aspect ratio will be greater, and sometimes far greater, than 7.0. For 32 nm technology, the aspect ratio may be greater than 10.

The increase in the aspect ratio causes problems. Referring to FIG. 1, in the filling of the opening, the high aspect ratio will adversely result in the formation of void 14, which is a result of the pre-mature sealing in the top region of the filling oxide 12. After a chemical mechanical polish (CMP) to remove excess oxide 12, STI region 16 is left in the opening, as is shown in FIG. 2. It is likely that void 14 is exposed after the CMP. In subsequent process steps, conductive materials such as polysilicon may be filled into the opening, causing the bridging, and even the shorting of integrated circuits in some circumstances.

Conventionally, oxide 12 is often formed using one of the two methods, high-density plasma (HDP) chemical vapor deposition and high aspect-ratio process (HARP). The HDP may fill gaps with aspect ratios less than about 6.0 without causing voids. The HARP may fill gaps with aspect ratios less than about 7.0 without causing voids. However, when the aspect ratios are close to 7.0, even if no voids are formed, the central portions of STI region 16 formed using the HARP are often weak. The weak portions may be damaged by the CMP processes or oxide wet dips, which in turn cause voids after the CMP or the oxide wet dips. When the aspect ratios further increase to greater than 7.0, voids start to appear even if the HARP is used. Accordingly, the existing gap-filling techniques can only fill gaps having aspect ratios less than 7.0 without causing voids. New gap-filling methods are thus needed.

SUMMARY OF THE INVENTION

In accordance with one aspect of the present invention, a method of forming a shallow trench isolation region includes providing a semiconductor substrate including a top surface; forming an opening extending from the top surface into the semiconductor substrate; filling a precursor into the opening using spin-on; performing a steam cure to the precursor to generate a dielectric material; performing a chemical mechanical polish (CMP) to the dielectric material after the steam cure; and performing a steam anneal to the dielectric material after the CMP.

In accordance with another aspect of the present invention, a method of forming an integrated circuit structure includes providing a semiconductor substrate including a top surface; forming an opening extending from the top surface into the semiconductor substrate; filling a first dielectric material into the opening using spin-on; performing a steam cure at a first temperature to the first dielectric material to generate a second dielectric material; performing a CMP to the second dielectric material after the steam cure; and performing a steam anneal to the second dielectric material at a second temperature lower than the first temperature after the CMP.

Advantageously, by using the embodiments of the present invention, shallow trench isolation regions having great aspect ratios, for example, greater than about 10 or even greater, may be formed without introducing voids.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming a shallow trench isolation (STI) region is provided. The intermediate stages in the manufacturing of a preferred embodiment of the present invention are illustrated. Throughout the various views and illustrative embodiments of the present invention, like reference numbers are used to designate like elements.

Figure 3:
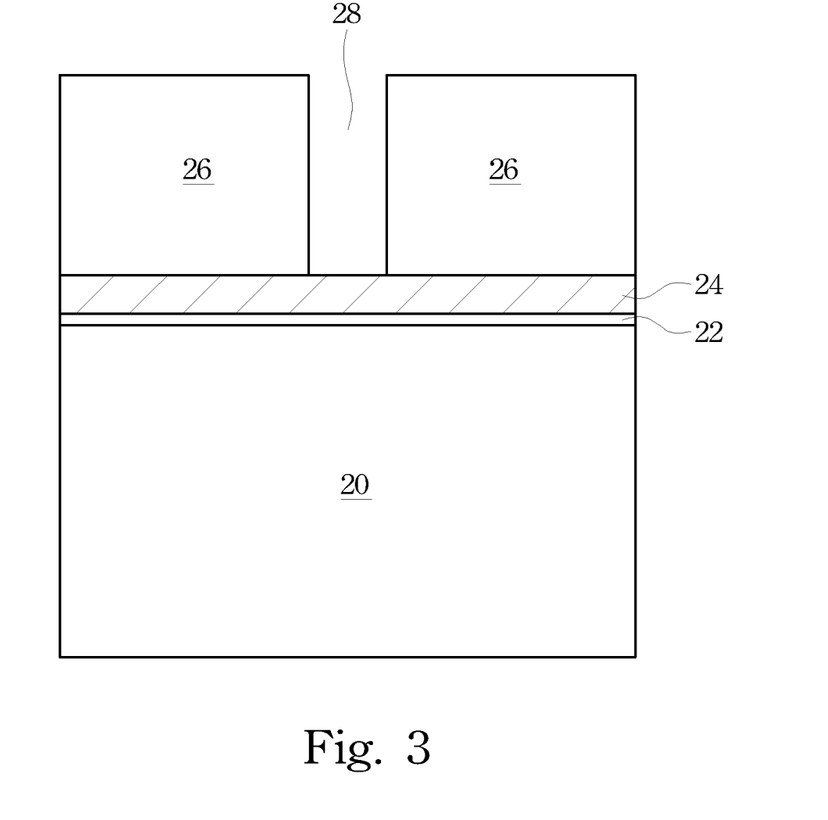
FIGS. 3 through 10 are cross-sectional views of intermediate stages in the manufacturing of an STI embodiment.

Referring to FIG. 3, semiconductor substrate 20 is provided. In the preferred embodiment, semiconductor substrate 20 includes silicon. However, other commonly used materials, such as carbon, germanium, gallium, arsenic, nitrogen, indium, and/or phosphorus, and the like, may also be included in semiconductor substrate 20. Semiconductor substrate 20 may be formed of single-crystalline or compound materials, and may be a bulk substrate or a semiconductor-on-insulator (SOI) substrate.

Pad layer 22, which is optional, and mask layer 24 are formed on semiconductor substrate 20. Pad layer 22 is preferably a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In the preferred embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography process. Photoresist 26 is formed on mask layer 24 and is then patterned, forming opening 28 in photoresist 26.

Figure 4:
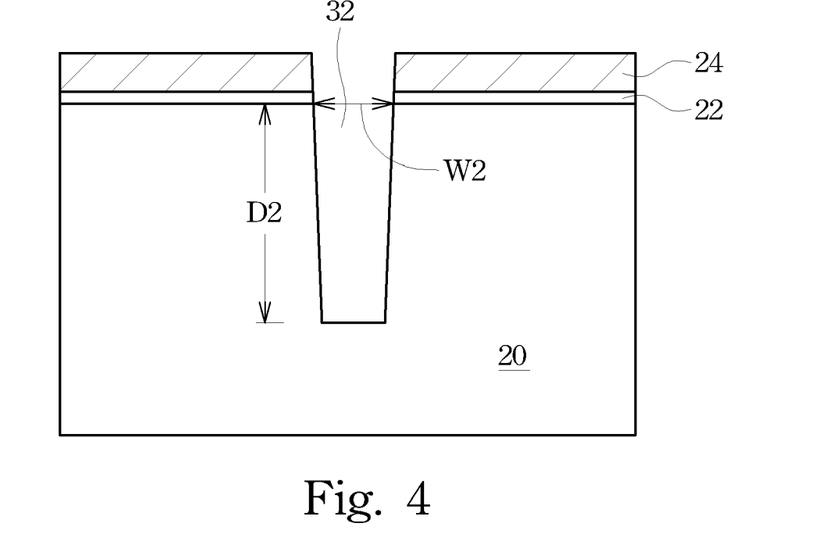

Referring to FIG. 4, mask layer 24 and pad layer 22 are etched through opening 28, exposing underlying semiconductor substrate 20. The exposed semiconductor substrate 20 is then etched, forming trench 32. Photoresist 26 is then removed. Next, a cleaning is preferably performed to remove a native oxide of semiconductor substrate 20. The cleaning may be performed using diluted HF. In an exemplary embodiment, the depth D2 of trench 32 is between about 2100 Å and about 2500 Å, while the width W2 is between about 420 Å and about 480 Å. One skilled in the art, however, will realize that the dimensions recited throughout the descriptions are merely examples, and may be changed to suit different scales of integrated circuits.

Figure 5:
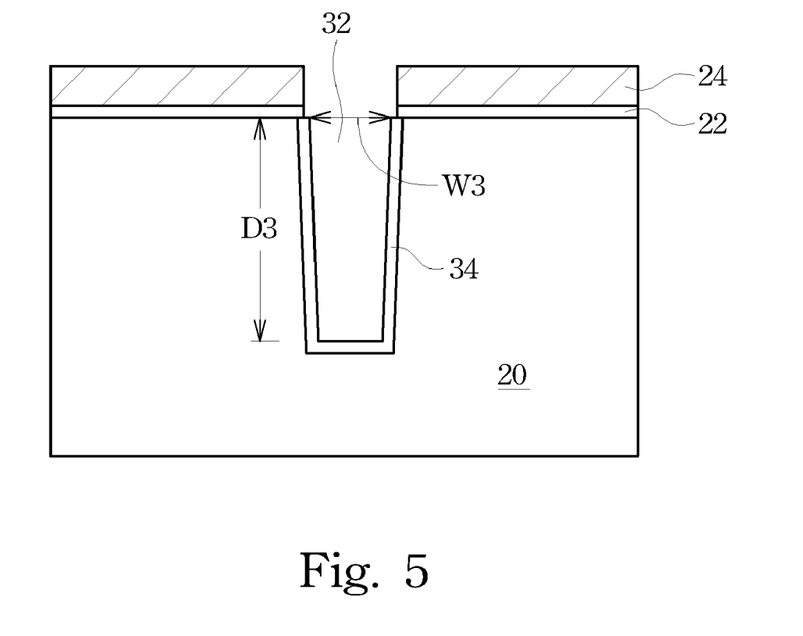

Liner oxide 34 is then formed in trench 32, as is shown in FIG. 5. In an embodiment, liner oxide 34 may be a thermal oxide having a preferred thickness of between about 20 Å to about 500 Å. In other embodiments, liner oxide 34 is formed using in-situ steam generation (ISSG). Alternatively, liner oxide 34 may be formed using a deposition technique that can form conformal oxide layers, such as selective area chemical vapor deposition (SACVD), high aspect ratio process (HARP), or the like. The formation of liner oxide 34 rounds the corners of trench 32, which reduces the electrical fields, and hence improves the performance of the resulting integrated circuit.

After the formation of liner oxide 34, the remaining portion of trench 32 has a width W3, which is measured at the same level as a top surface of semiconductor substrate 20, and a depth D3. The ratio of depth D3 to width W3 is referred to the aspect ratio of trench 32. Due to the small thickness of liner oxide 34, this aspect ratio is close to the aspect ratio of trench 32 in FIG. 4. In an exemplary embodiment, the aspect ratio of trench 32 is greater than about 7.0. In other exemplary embodiments, the aspect ratio may be greater than about 8.5, or even greater than about 10, although the aspect ratio may also be any value ranging from less than about 7.0 to greater than about 10.

Figure 6:
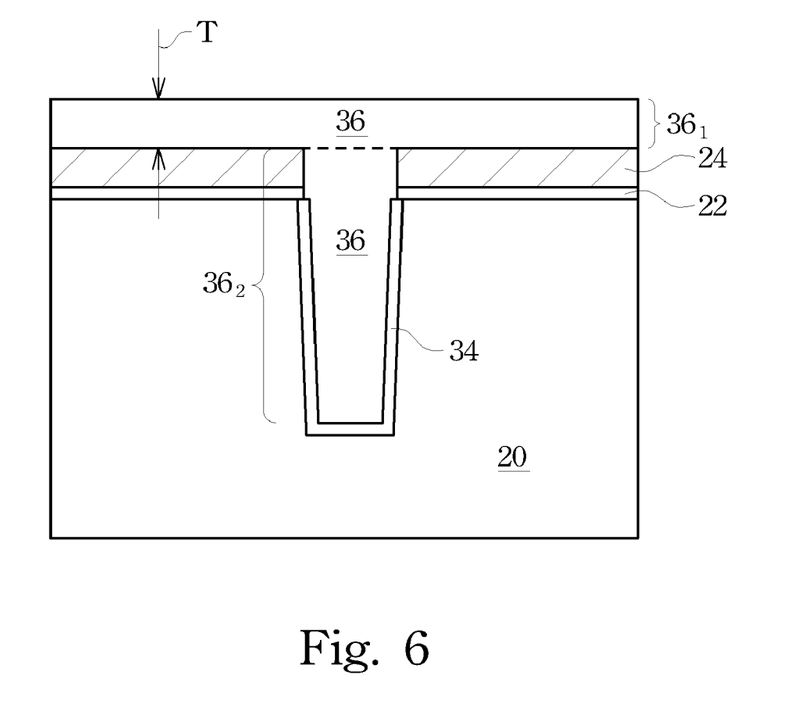

Referring to FIG. 6, trench 32 is filled with dielectric material 36. Dielectric material 36 is formed using spin-on, and hence is a spin-on dielectric (SOD) material. In an exemplary embodiment, dielectric material 36 comprises perhydro-polysilazane (—$(SiH_2NH)_n$—). Since dielectric material 36 will be converted to silicon oxide in subsequent steps, it may also be referred to as a precursor. Perhydro-polysilazane is in a liquid form, and hence can fill trench 32 with no void formed, even if the aspect ratio of trench 32 is greater than 10. Dielectric material 36 comprises portion $36_1$ over the top surface of mask layer 24, and portion $36_2$ inside trench 32. The thickness T of portion $36_1$ affects the subsequent processes, and hence need to be controlled. In an embodiment, thickness T is between about 100 nm and about 900 nm.

Next, a steam cure is performed. In an embodiment, the steam cure is performed at an elevated temperature, with process gases including hydrogen and oxygen. Carrier gases, such as nitrogen, may also be added. Hydrogen and oxygen react with each other to form steam ($H_2O$), which is used to cure dielectric material 36 and to convert dielectric material 36 into a solid and stable material. In the case dielectric material 36 comprises perhydro-polysilazane, the steam cure converts perhydro-polysilazane to silicon oxide. An exemplary chemical reaction equation may be expressed as:

$$—(SiH_2NH)—+2H_2O \rightarrow SiO_2+NH_3+2H_2 \qquad \text{[Eq. 1]}$$

Figure 7:
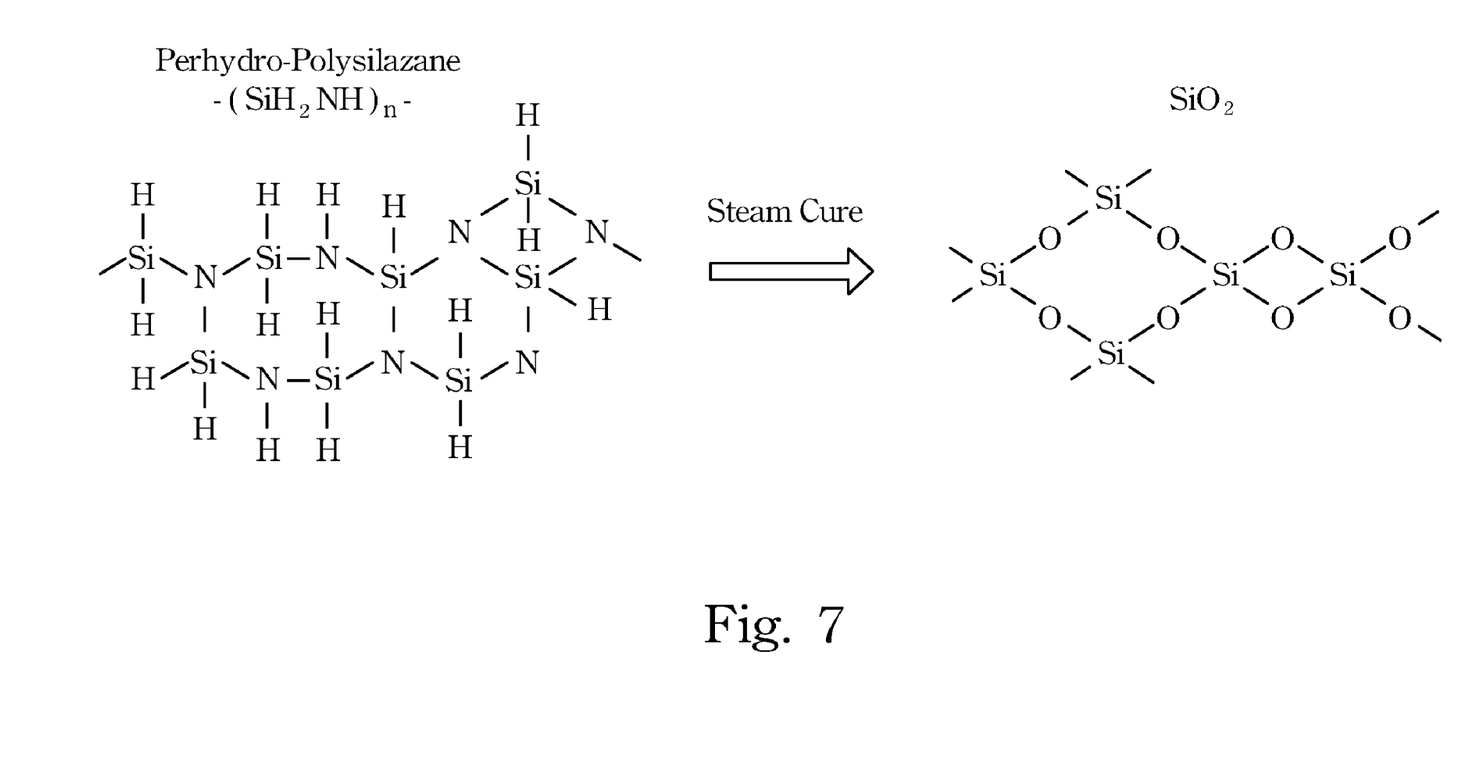
Figure 8:
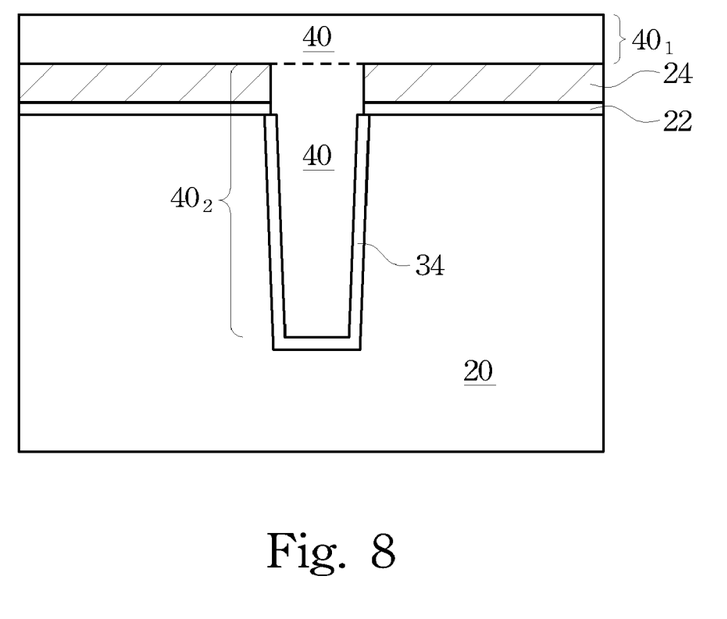

The structure of the materials before and after the steam cure is schematically illustrated in FIG. 7. It is noted that the reaction results in silicon oxide, ammonia, and hydrogen, wherein ammonia and hydrogen are gaseous, and hence only silicon oxide is left. FIG. 8 illustrates the resulting structure after the steam cure, wherein dielectric material 40 is the resulting material of the steam cure.

In addition to converting and solidifying dielectric material 36, the steam cure also has the function of densifying and improving the mechanical property of the resulting silicon oxide. During the steam cure, the portion $40_1$ of dielectric material 40, which is over the top surface of mask layer 24, is preferably substantially fully densified. In an embodiment, the degree of the densification may be measured using wet etching rate ratio (WERR), which measures how fast a dielectric material (such as silicon oxide) can be etched by a wet etching with relative to the wet etching rate of thermal silicon oxide. For example, a WERR (of a dielectric material) of 2 indicates the dielectric material is etched twice as fast as thermal silicon oxide. When substantially fully densified, dielectric material portion $40_1$ has a WERR less than, for example, about 2. On the other hand, portion $40_2$ (particularly the bottom part of portion $40_2$) is preferably only partially densified, and its WERR may be greater than about 2, and more preferably greater than about 5. It is realized that the property of dielectric material 40 may gradually change from the top to the bottom, and hence a top part of portion $40_2$ may also have a low WERR close to that of portion $40_1$. Exemplary process conditions for achieving this result include, for example, a temperature of greater than about 1000° C., and more preferably about 1100° C., and an anneal duration of about two to three hours. A ratio of a combined partial pressure of hydrogen and oxygen to the pressure of all of the process gases for the steam cure is preferably greater than about 0.5.

Figure 9:
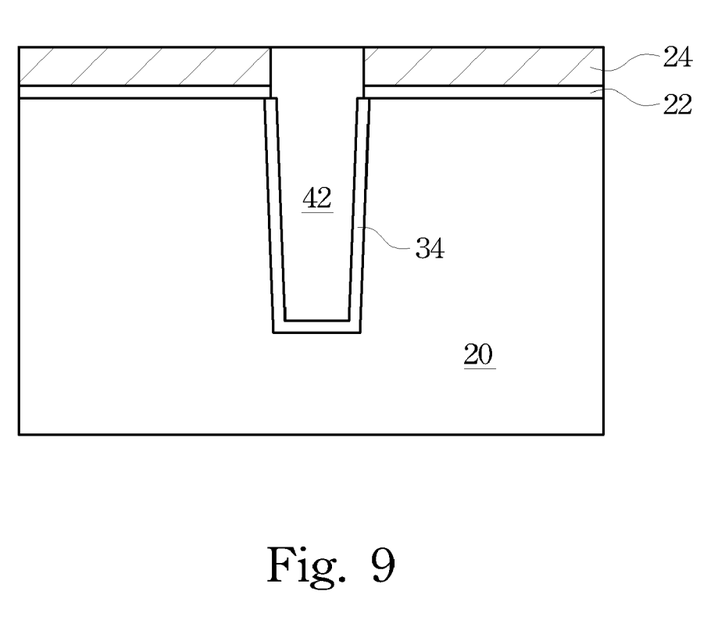

A chemical mechanical polish (CMP) is then performed to remove dielectric material portion $40_1$, forming a structure as shown in FIG. 9. Mask layer 24 may act as a CMP stop layer. The remaining portion of dielectric material 40 forms STI region 42. In the above-discussed steam cure step, the mechanical property of portion $40_1$ has been improved, and hence the CMP can be performed without damaging mask layer 24 or STI region 42.

After the CMP step, a steam anneal is performed to the structure shown in FIG. 9. Preferably, the steam anneal results in an improvement in the property of STI region 42. In other words, the steam anneal results in a densification of STI region 42. The steam anneal may be performed using similar process gases as the step of steam cure, including hydrogen and oxygen that form steam, and carrier gases such as nitrogen. It is to be noted that the steam anneal will also cause the adverse oxidation of semiconductor substrate 20, particularly at the sidewall portion of semiconductor substrate 20 in trench 32 (refer to FIG. 5). Further, the degree of the oxidation is affected by the temperature, the partial pressure of the steam, and/or the duration of the steam anneal. It is desirable that the steam anneal causes substantially full densification of STI region 42, while the resulting adverse oxidation of semiconductor substrate 20 is as less severe as possible. To achieve such an effect, the temperature of the steam anneal is preferably lower than the temperature of the steam cure. Further, the combined partial pressure of the hydrogen and oxygen is lower than that in steam cure. In an exemplary embodiment, the temperature for the steam anneal is about 600° C., and the ratio of a combined partial pressure of hydrogen and oxygen to the pressure of all of the process gases for the steam anneal is less than about 30 percent. In other words, the partial pressure of hydrogen and oxygen in the steam anneal may be less than about 60 percent of the respective partial pressure for the steam cure. The duration of the steam anneal may be about two to three hours. Experiment results have shown that the controlling of the temperature is important for effectively densifying STI region 42, while reducing the adverse oxidation as much as possible. Experimental results have revealed that if the temperature of the steam anneal is raised from about 600° to about 700° C., the thickness of oxidized semiconductor substrate doubles. Therefore, the careful control of the temperature of the steam anneal is very important.

After the steam anneal, a dry anneal may be performed, wherein the annealing temperature may be about 1050° C. to about 1100° C. In the dry anneal, no steam is introduced.

Figure 10:
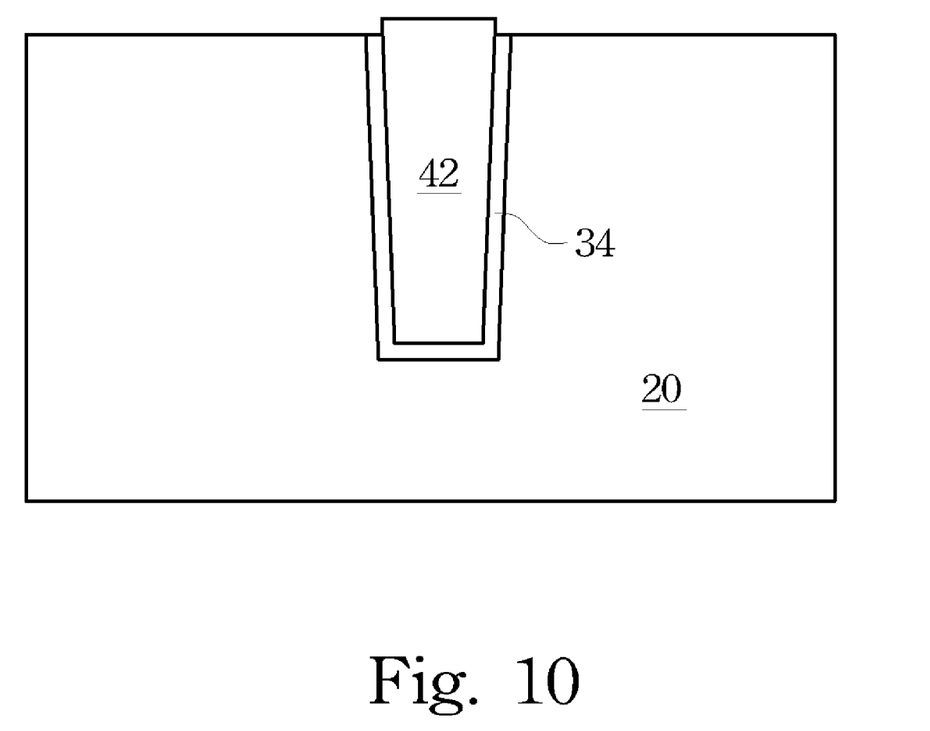

Mask layer 24 and pad layer 22 are then removed, as shown in FIG. 10. Mask layer 24, if formed of silicon nitride, may be removed by a wet clean process using hot $H_3PO_4$, while pad layer 22 may be removed using diluted HF, if formed of silicon oxide. It is noted that STI region 42 has been densified, and hence the removal of pad layer 22 will not cause a significant portion of STI region 42 to be removed. As discussed in the preceding paragraphs, pad layer 22 is optional, and hence may not be formed in alternative embodiments.

In the resulting structure as shown in FIG. 10, STI region 42 has an improved property over STI materials without going through the steam anneal. The improvement in the property is reflected by the reduced WERR, which may be less than about 2. Experiments have revealed that the WERR of STI region 42 may be as low as about 1.30, which is comparable to the WERR (about 1.25) of silicon oxide formed using high aspect ratio process (HARP). As a comparison, if only the steam cure is performed (with no steam anneal performed), the WERR may reach 6 or 7. With WERR as high as 6 or 7, in the wet dip processes commonly used in the subsequent integrated circuit formation processes, such as the pre-clean before the formation of gates of MOS transistors, one-half of the thickness of the STI region may be lost, rendering the resulting STI region unusable.

The embodiments of the present invention have several advantageous features. The two-step process (steam cure before CMP and steam anneal after CMP) advantageously improves the property of STI region 42 without causing excessive oxidation of semiconductor substrate 20. As a comparison, if the steam cure is used to fully densify the STI region 42 (portion $40_2$, refer to FIG. 8) without resorting to the steam anneal, significant portions of semiconductor substrate 20 will be oxidized, and the sizes of the active region between STI regions will be adversely reduced. By using the two-step steam cure/anneal process, SOD may be used for STI gap filling, and hence the aspect ratio of the STI regions may be greater than about 10 with no void formed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
   providing a semiconductor substrate comprising a top surface;
   forming an opening extending from the top surface into the semiconductor substrate;
   filling a precursor into the opening using spin-on;
   performing a steam cure to the precursor to generate a dielectric material, wherein the steam cure is performed using hydrogen and oxygen with a first combined partial pressure of hydrogen and oxygen;
   after the steam cure, performing a chemical mechanical polish (CMP) to the dielectric material; and
   after the CMP, performing a steam anneal to the dielectric material, wherein the steam anneal is performed using hydrogen and oxygen with a second combined partial pressure of hydrogen and oxygen, and wherein the first partial pressure is greater than the second partial pressure.

2. The method of claim 1, wherein the steam cure is performed at a first temperature and the steam anneal is performed at a second temperature lower than the first temperature.

3. The method of claim 2, wherein the first temperature is higher than about 1000° C. and the second temperature is lower than about 700° C.

4. The method of claim 1, wherein after the steam cure and before the CMP, a first portion of the dielectric material in the opening has a first wet etching rate ratio (WERR) greater than a second WERR of a second portion of the dielectric material over the opening.

5. The method of claim 4, wherein after the steam anneal, the first portion of the dielectric material has a WERR of less than about 2.

6. The method of claim 1, wherein the precursor comprises perhydro-polysilazane.

7. A method of forming an integrated circuit structure, the method comprising:
   providing a semiconductor substrate comprising a top surface;
   forming an opening extending from the top surface into the semiconductor substrate;
   filling a first dielectric material into the opening using spin-on;
   performing a steam cure at a first temperature to the first dielectric material to generate a second dielectric material;
   after the steam cure, performing a chemical mechanical polish (CMP) to the second dielectric material; and after the CMP, performing a steam anneal to the second dielectric material at a second temperature lower than the first temperature, wherein the steam cure has a first combined partial pressure of hydrogen and oxygen, the steam anneal has a second combined partial pressure of hydrogen and oxygen, and wherein the second combined partial pressure is lower than the first partial pressure.

8. The method of claim 7, wherein the first temperature is higher than about 1000° C. and the second temperature is lower than about 700° C.

9. The method of claim 8, wherein the first temperature is higher than about 1000° C. and the second temperature is lower than about 600° C.

10. The method of claim 7, wherein after the steam cure and before the CMP, a first portion of the second dielectric material in the opening has a first wet etching rate ratio (WERR) greater than a second WERR of a second portion of the second dielectric material over the opening.

11. The method of claim 10, wherein after the steam cure and before the CMP, the first WERR is greater than about 2.

12. The method of claim 10, wherein after the steam anneal, the first WERR is less than about 2.

13. The method of claim 7, wherein the first dielectric material comprises perhydro-polysilazane.

* * * * *